United States Patent
Haitz et al.

(10) Patent No.: US 10,107,459 B2
(45) Date of Patent: Oct. 23, 2018

(54) LIGHT-EMITTING DEVICE WITH REMOTE PHOSPHOR AND RECESSED LIGHT EMITTING ELEMENT

(71) Applicant: Quarkstar LLC, Las Vegas, NV (US)

(72) Inventors: Roland H. Haitz, Portola Valley, CA (US); Hans Peter Stormberg, Stolberg (DE)

(73) Assignee: Quarkstar LLC, Las Vegas, NV (US)

( * ) Notice: Subject to any disclaimer, the term of this patent is extended or adjusted under 35 U.S.C. 154(b) by 183 days.

(21) Appl. No.: 14/892,549

(22) PCT Filed: May 19, 2014

(86) PCT No.: PCT/US2014/038650
§ 371 (c)(1),
(2) Date: Nov. 19, 2015

(87) PCT Pub. No.: WO2014/189855
PCT Pub. Date: Nov. 27, 2014

(65) Prior Publication Data
US 2016/0102821 A1    Apr. 14, 2016

Related U.S. Application Data

(60) Provisional application No. 61/826,425, filed on May 22, 2013.

(51) Int. Cl.
| | |
|---|---|
| *F21K 99/00* | (2016.01) |
| *F21V 7/04* | (2006.01) |
| *F21K 9/64* | (2016.01) |
| *H01L 33/50* | (2010.01) |

(52) U.S. Cl.
CPC ............... *F21K 9/56* (2013.01); *F21K 9/64* (2016.08); *F21V 7/04* (2013.01); *H01L 33/505* (2013.01); *H01L 33/507* (2013.01)

(58) Field of Classification Search
CPC ..... F21K 9/56; F21K 9/64; F21V 7/04; H01L 33/505; H01L 33/507
See application file for complete search history.

(56) References Cited

U.S. PATENT DOCUMENTS

| | | | |
|---|---|---|---|
| 6,527,411 | B1 | 3/2003 | Sayers |
| 2006/0152931 | A1 | 7/2006 | Holman |
| 2007/0018102 | A1 | 1/2007 | Braune |

(Continued)

FOREIGN PATENT DOCUMENTS

| | | |
|---|---|---|
| WO | WO2014043384 A1 | 3/2014 |
| WO | WO2014043410 A1 | 3/2014 |

OTHER PUBLICATIONS

Authorized Officer Shane Thomas, Notification of Transmittal of the International Search Report and the Written Opinion, International Application No. PCT/US14/38650, dated Sep. 16, 2014, 9 pages.

*Primary Examiner* — Mary Ellen Bowman
(74) *Attorney, Agent, or Firm* — Fish & Richardson P.C.

(57) ABSTRACT

A variety of light-emitting devices are disclosed that are configured to output light provided by a light-emitting element (LEE). In general, embodiments of the light-emitting devices feature a light-emitting element disposed in a recess, a scattering element that is spaced apart from the light-emitting element and an extractor element coupled to the scattering element.

23 Claims, 5 Drawing Sheets

(56) References Cited

U.S. PATENT DOCUMENTS

| | | | |
|---|---|---|---|
| 2007/0120135 A1* | 5/2007 | Soules | H01L 33/507 |
| | | | 257/98 |
| 2007/0273282 A1 | 11/2007 | Radkov | |
| 2009/0200939 A1 | 8/2009 | Lenk et al. | |
| 2010/0172120 A1 | 7/2010 | Wegh et al. | |
| 2010/0263723 A1 | 10/2010 | Allen et al. | |
| 2011/0176091 A1 | 7/2011 | Boonekamp et al. | |
| 2011/0309384 A1* | 12/2011 | Ito | H01L 33/505 |
| | | | 257/88 |
| 2013/0021776 A1 | 1/2013 | Veerasamy et al. | |
| 2013/0039090 A1* | 2/2013 | Dau | F21S 8/04 |
| | | | 362/551 |
| 2014/0334126 A1* | 11/2014 | Speier | F21V 7/0091 |
| | | | 362/84 |

\* cited by examiner

LIGHT-EMITTING DEVICE WITH REMOTE PHOSPHOR AND RECESSED LIGHT EMITTING ELEMENT

CROSS-REFERENCE TO RELATED APPLICATION

This application is a U.S. National Stage of International Application No. PCT/US2014/038650, filed May 19, 2014, which claims benefit under 35 U.S.C. § 119(e)(1) of U.S. Provisional Application No. 61/826,425, filed on May 22, 2013, the entire contents of which is incorporated by reference herein.

TECHNICAL FIELD

The present technology relates generally to light-emitting devices and, in particular, to light-emitting devices that feature a solid state light-emitting element, a scattering element (e.g., a phosphor element) remote from the light-emitting element, and an extractor element.

BACKGROUND

Light-emitting elements are ubiquitous in the modern world, being used in applications ranging from general illumination (e.g., light bulbs) to lighting electronic information displays (e.g., backlights and front-lights for LCDs) to medical devices and therapeutics. Solid state light emitting devices, which include light emitting diodes (LEDs), are increasingly being adopted in a variety of fields, promising low power consumption, high luminous efficacy and longevity, particularly in comparison to incandescent and other conventional light sources.

One example of a SSL device increasingly being used for in luminaires is a so-called "white LED." Conventional white LEDs typically include an LED that emits blue or ultraviolet light and a phosphor or other luminescent material. The device generates white light via down-conversion of blue or UV light from the LED (referred to as "pump light") by the phosphor. Such devices are also referred to as phosphor-based LEDs (PLEDs). Although subject to losses due to light-conversion, various aspects of PLEDs promise reduced complexity, better cost efficiency and durability of PLED-based luminaires in comparison to other types of luminaires.

While new types of phosphors are being actively investigated and developed, configuration of PLED-based light-emitting devices, however, provides further challenges due to the properties of available luminescent materials. Challenges include light-energy losses from photon conversion, phosphor self-heating from Stokes loss, dependence of photon conversion properties on operating temperature, degradation due to permanent changes of the chemical and physical composition of phosphors in effect of overheating or other damage, dependence of the conversion properties on intensity of light, propagation of light in undesired directions in effect of the random emission of converted light that is emitted from the phosphor, undesired chemical properties of phosphors, and controlled deposition of phosphors in light-emitting devices, for example.

SUMMARY

The present technology relates generally to light-emitting devices and, in particular, to light-emitting devices that feature a solid state light-emitting element, a scattering element (e.g., a phosphor element) remote from the light-emitting element, and an extractor element.

Accordingly, various aspects of the invention are summarized as follows.

In general, in a first aspect, the invention features light-emitting devices that include an LED pump or a semiconductor laser configured to emit pump light during operation; a phosphor element having a first surface spaced apart from the LED pump or semiconductor laser and positioned to receive at least some pump light from the LED pump or semiconductor laser, the phosphor element configured to convert pump light to converted light and to scatter non-converted pump light, where the converted pump light and the scattered non-converted pump light are provided by the phosphor element as scattered light; an extractor element formed from a transparent material having an exit surface, the extractor element being arranged to receive a portion of the scattered light through a region of contact with the phosphor element; and a reflector forming a recess, the LED pump or semiconductor laser being disposed in the recess, the reflector and the phosphor element defining an enclosure into which pump light from the LED pump or semiconductor laser is emitted, at least a portion of the first surface having a concave shape with respect to the enclosure, where a medium having a refractive index $n_0$ is disposed adjacent the first surface of the phosphor element, and the phosphor element comprises a material having a first refractive index $n_1$, where $n_0 < n_1$, and the transparent material has a refractive index $n_2$, where $n_0 < n_2$, and the exit surface is shaped and positioned such that an angle of incidence on the exit surface of the scattered light from the region of contact that directly impinges on the exit surface is less than the critical angle for total internal reflection.

The foregoing and other embodiments can each optionally include one or more of the following features, alone or in combination. In some embodiments, the first surface can extend laterally beyond the recess. In some embodiments, an area of an aperture of the recess can be a fraction of an area of the base substrate enclosed by the scattering element. The fraction can be about ten percent or less. In some embodiments, a height of the LED pump or semiconductor laser can be 1.5 times a height of the recess or less. The height of the LED pump or semiconductor laser can be less than the height of the recess. In some embodiments, the recess can extend to at least two points of the first surface. In some embodiments, the recess can extend to the first surface. In some embodiments, the phosphor element can be a shell. The shell can have a spherical shape or an ellipsoidal shape. The ellipsoidal shape can be prolate, oblate, or triaxial.

In some embodiments, an optical axis of the recess can be collinear with an optical axis of the phosphor element. In some embodiments, the recess can be configured to provide reflective properties different from reflective properties of other portions of the reflector. In some embodiments, the phosphor element can contact the reflector. In some embodiments, the reflector can extend to the exit surface. In some embodiments, the light-emitting device can further include an external reflector extending from the exit surface. The external reflector and the reflector can be integrally formed or the external reflector and the reflector can be formed from different materials, for example. In some embodiments, refractive index $n_1 \leq$ refractive index $n_2$. In some embodiments, the phosphor element can include inelastic and elastic scattering centers. The inelastic and elastic scattering centers can be configured to substantially isotropically scatter light.

Reference numbers and designations in the various drawings indicate exemplary aspects of implementations of particular features of the present disclosure.

DETAILED DESCRIPTION

Figure 1A:
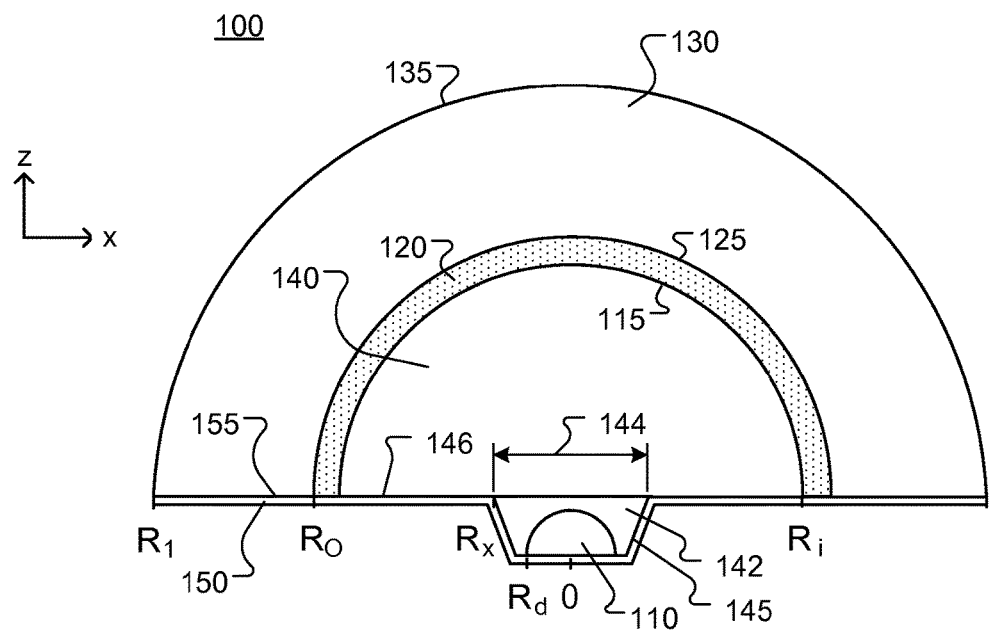
FIGS. 1A-1B are cross-sectional views of an example of a light-emitting device with a recessed light-emitting element.
Figure 1B:
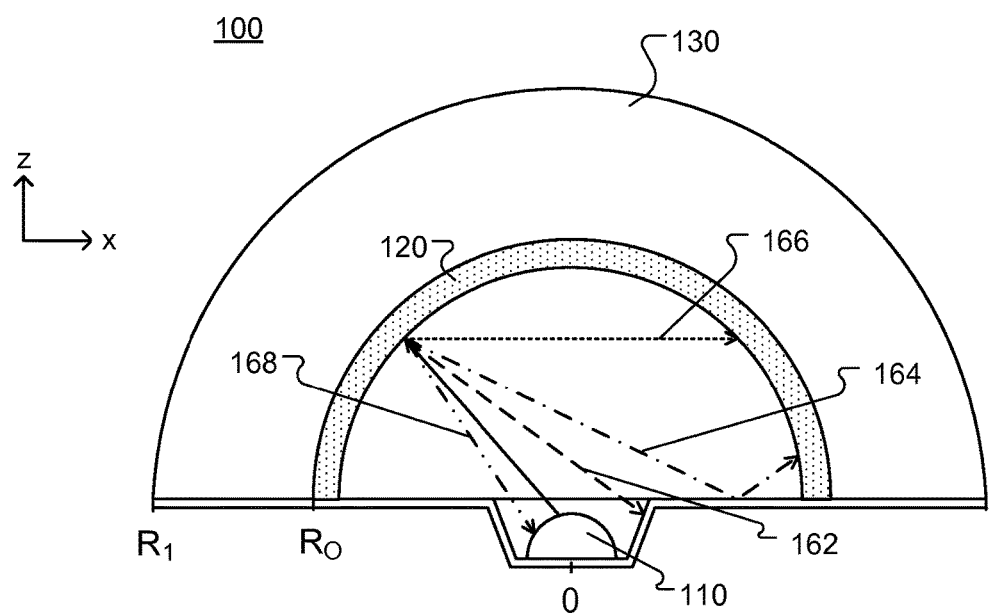

FIGS. 1A and 1B are a cross-sectional side view of a light-emitting device 100 with a recessed light-emitting element 110 (e.g., a blue pump light-emitting diode (LED)). The light-emitting device 100 includes a base substrate 150, a scattering element 120 (e.g., a phosphor element), along with extractor element 130. The base substrate 150 has a surface 155, which can be reflective (e.g., a diffuse or specular reflector, such as a mirror). The scattering element 120 has an input surface 115 spaced apart from the light-emitting element 110 and positioned to receive light emitted from the light-emitting element 110. The scattering element 120 has another surface 125 (e.g., an optical interface) opposite the input surface 115. Extractor element 130 has an exit surface 135 through which light exits the light-emitting device 100.

The base substrate 150 includes a planar portion 146 and a recess, in which the light-emitting element 110 is placed. The base substrate 150 supports the light-emitting element 110 relative to the input surface 115. The recess defines an opening in the planar portion 146 through which the light-emitting element 110 illuminates the input surface 115. The scattering element 120 and the base substrate 150 with the recess together enclose the light-emitting element 110 and form an enclosure. The enclosure includes an upper portion 140 defined by the planar portion 146 and the input surface 115 and a lower portion 142 defined by the recess.

The recess in the base substrate 150 is shaped such that the light-emitting element 110 does not protrude beyond the lower portion 142 of the enclosure into the upper portion 140 of the enclosure, i.e., the depth of the recess is the same as or larger than the height of the light-emitting element 110. The recess forms an aperture 144. Cartesian x-z axes are provided for reference. In some embodiments, the recess is sized relative to the size of the light-emitting element placed into the recess or vice versa. For example, the depth and/or width of the light-emitting element can be used to define the depth and/or width of the recess. For example, the height of the light-emitting element may be within a range of 0 to 1 mm of the depth of the recess.

As shown in FIG. 1A, the aperture 144 has a lateral dimension Rx (a radial dimension in the x-direction measured from an origin "0" corresponding to a central point of the light-emitting element 110). Light-emitting element 110 has a radial dimension Rd, surface 125 of scattering element 120 has a radial dimension of Ro, input surface 115 has a radial dimension Ri, and exit surface 135 of extractor element 130 has a radial dimension R1. In general, the relative dimensions of the extractor element 130, the scattering element 120, and the aperture 144 can vary. R1 is larger than Ro. Depending on the implementation, R1 can be about 100 mm or less (e.g., about 50 mm or less, about 40 mm or less, about 35 mm or less, about 30 mm or less), for example. Ro can be about 70 mm or less (e.g., about 40 mm or less, about 30 mm or less, about 25 mm or less, about 20 mm or less, about 15 mm or less), for example.

The difference between Ri and Ro corresponds to the thickness of scattering element 120. Rx is small relative to Ri (e.g., about 0.2 Ri or less, about 0.15Ri or less, about 0.1Ri or less, about 0.05Ri or less). As discussed in more detail below, it is believed that losses due to light scattered from scattering element 120 into the enclosure being reabsorbed by the light-emitting element 110 can be reduced when Rx is small relative to Ri. Generally, Rx is no smaller than a radial dimension Rd of the light-emitting element 110. Depending on the implementation, the recess can be tapered, as shown in FIGS. 1A and 1B, so that light emitted by the light-emitting element 110 that impinges on side surface 145 of the recess is reflected towards the scattering element 120. Thus, Rx is generally larger than Rd.

In some embodiments, the side surface can comprise an involute shape (not illustrated) based on the shape of the outer surface of the light-emitting element. In case of FIG. 1A, the outer surface of the LEE 110 has a dome shape. Depending on the implementation, an involute shape may extend up to the height of the dome (in z-direction as illustrated in FIG. 1A) to avoid trapping light in the lower portion of the enclosure. If the recess is deeper than the height of the light-emitting element the protruding portion can be shaped to allow light from the LEE to escape into the upper portion of the enclosure, for example as described in International Patent Application Publication No. WO 2014/043393.

Certain dimensions of the light-emitting device 100 may be determined, at least in part, by the size of the light-emitting element 110, for example. An exemplary embodiment has a light-emitting element with a radial dimension Rd (e.g., 3 mm), an aperture with a radial dimension Rx=2×Rd (e.g., 6 mm), an input surface of a scattering element with a radial dimension Ri=6×Rd (e.g., 18 mm), and an exit surface of an extractor element with a radial dimension R1=10×Rd (e.g., 30 mm). These dimensions are only an example for a light-emitting device and other dimensions are also possible.

During operation, some light is backscattered from scattering element 120 into the enclosure. A portion of this light propagates from the scattering element directly to another location of the scattering element (approximately 50% for a semispherical phosphor), while a portion of the light is backscattered toward the base substrate 150. It is believed that the area of the aperture 144 relative to the area of the planar portion 146 of the base substrate affects the loss of photons of the light-emitting device, i.e., the smaller the area of the aperture 144 relative to the area of the planar portion 146, the smaller the loss of photons. For example, as a rough approximation, the proportion of light backscattered from scattering element 120 towards base substrate 150 that enters aperture 144 is approximately the same as the relative area of the aperture 144 relative to the area of base substrate 150 enclosed by the scattering element 120 (i.e., the footprint of the scattering element 120 on the base substrate 150). Accordingly, it is believed that where the aperture 144 has an area that is approximately 10% of the footprint of the scattering element 120, only about 10% of the backscattered light that propagates towards the base substrate 150 enters the recess, while the remaining 90% is reflected back to the scattering element by a single reflection off the reflective surface of the base substrate 150. Accordingly, in certain embodiments, the area of the aperture 144 is relatively small (e.g., about 30% or less, about 20% or less, about 15% or less, about 10% or less) compared with the area enclosed by the footprint of scattering element 120.

FIG. 1B illustrates the reduced absorption of backscattered light achievable using a recess. Specifically, FIG. 1B shows rays 162, 164, 166, and 168 that are returned through the input surface 115 into the enclosure (i.e., backscattered light). Ray 166 directly propagates from one portion of the scattering element 120 to another portion of the scattering element 120 and therefore is free of any reflection losses. Ray 164 propagates from a portion of the scattering element 120 to the planar portion 146 and is reflected back towards the scattering element 120. That is, the ray 164 is redirected to the scattering element 120 by the planar portion 146 via a single reflection. Ray 162 propagates from a portion of the scattering element 120 into the lower portion 142 of the enclosure and impinges onto the side surface 145 of the recess. Once a ray enters the lower portion 142 of the enclosure and impinges onto the side surface 145 of the recess, the ray can be reflected back towards the scattering element 120 in one or more reflections, or reflected towards the light-emitting element 110, where the ray may be absorbed. Ray 168 directly propagates from a portion of the scattering element 120 to the light-emitting element 110, where ray 168 may be absorbed.

It is believed that direct propagation of a ray from one portion of the scattering element to another portion of the scattering element results in the least amount of loss (e.g., substantially 0%), a single reflection off the planar portion 146 results in a small loss (e.g., 2%), and one or more reflections and potential absorption within the lower portion 142 of the enclosure results in the highest potential loss (e.g., average 20%).

While the light-emitting element 110 has a height that is less than the depth of the recess and the light-emitting element is completely contained within lower portion 142, in certain embodiments the light emitting element can extend into upper portion 140. However, the likelihood of absorption by backscattered light increases the further into upper portion 140 of the enclosure the light-emitting element 110 extends.

The following table shows an example of approximate losses for a light-emitting device with an aperture (e.g., aperture 144) being approximately 10% of the area enclosed by the scattering element on the base substrate:

| Backscattering from Hemi-Spherical Scattering Element (SE) | | | | |
|---|---|---|---|---|
| | SE to SE (e.g., ray 166) | SE to reflector to SE (e.g., ray 164) | SE to recess to SE (e.g., rays 162, 168) | Total loss |
| Portion of backscattered light | 50% | 45% | 5% | |
| Loss factor | 0% | 2% | 20% | |
| Loss | 0.0% | 0.9% | 1% | 1.9% |

In this example, 50% of the backscattered light propagates directly to another portion of the scattering element at 0% loss in the enclosure, 45% of the backscattered light propagates from a portion of the scattering element to the portion of the base substrate outside the lower enclosure at about 2% loss, and 5% of the backscattered light propagates from a portion of the scattering element into the lower portion of the enclosure at about 20% loss. Thus, the overall effective backscattering loss in this example is approximately 2%.

In some embodiments, the medium in the enclosure has a refractive index n0 and the scattering element 120 has a refractive index n1, where n0<n1. If the scattering element 120 is formed from a composite material, n1 may refer to the effective refractive index of the element or the refractive index of a host component of the composite material, as the case may be. The host component may refer to a binder or a material occupying a large portion of the volume of the composite material, for example. Light from the scattering element 120 that reaches the input surface 115 is referred to as backward light.

In embodiments with n0<n1, the input surface 115 allows only a fraction of the backward light within the scattering element to escape into the low-index medium of the enclosure. Only light within the scattering element 120 that impinges on the input surface 115 at an angle smaller than the critical angle for TIR will partially transmit into the enclosure through the input surface 115. Light within the scattering element 120 impinging on the input surface 115 at an angle at or greater than the critical angle for total internal reflection (TIR) is reflected back into the scattering element 120.

In some embodiments, the refractive indices n0 may have about the same magnitude as n1 or even be a bit larger. This may be the case in embodiments in which the enclosure is filled with silicone or formed of glass or plastic, for example. Such embodiments can still achieve asymmetry of light propagation in a preferably forward direction, provided the geometry of the enclosure can offset a lack of TIR of backscattered light from the scattering element through an input surface back into the enclosure via efficient recycling of the backscattered light back into a forward direction. Such embodiments can provide enhanced mixing of backscattered light and as such enhance chromaticity and/or luminance isotropy within certain solid angle ranges.

In some embodiments, the transparent material of the extractor element 130 has a refractive index n2, where n0<n2. Consequently, the refractive index mismatch between scattering element 120 and enclosure may differ from the refractive index mismatch between extractor element 130 and scattering element 120, and the transmission properties of light within scattering element 120 incident at these interfaces will differ accordingly. In some embodiments, the refractive index mismatches are selected so that forward transmission of light (i.e., from the scattering element into the extractor element) is greater than backward transmission into the low index medium of the enclosure, and the light-emitting device 100 asymmetrically propagates scattered light. Such an asymmetry may be conceptualized in terms of acceptance cones, that is solid angles within which light can transmit through an optical interface. As such and depending on the embodiment, light-emitting devices may be configured to provide acceptance cones at surface 125 that are wider than acceptance cones at surface 115.

In such a case, depending on the degree of asymmetry between n1/n0 and n2/n1 varying ratios of forward to backward light transmission can be provided. It is believed that the maximum asymmetry is reached if n2 is equal to or larger than n1 and n0=1.0, for example, if the medium in the enclosure is air or another gas. Light-emitting devices that feature asymmetric optical interfaces (i.e., different refractive index mismatches) on opposing sides of the scattering element are referred to as asymmetric scattering light valves (ASLV), or ASLV light-emitting devices.

In the device illustrated in FIGS. 1A and 1B, light propagation asymmetry arises, for example, from the medium in the enclosure (index n0) and the material of the extractor element 130 (index n2) the scattering element 120 with index n1 being unequal. For instance, to illustrate the asymmetric propagation by a specific example, if n1=1.5 and n0=1.0, that is n0<n1, a large fraction (e.g., ~75%) of the isotropically distributed photons impinging on the input surface 115 will be reflected by total internal reflection (TIR) back into the scattering element 120 and only a smaller fraction (e.g., ~25%) will be transmitted backwards into the enclosure where some may be subject to multiple reflections or absorption by the light-emitting element 110. At the surface 125, the condition n1≤n2 means that substantially all photons reaching the surface 125 will transition into the extractor element 130.

The scattering element 120 is shaped such that the light-emitting element 110 is spaced apart from the scattering element 120. The scattering element 120 is in the shape of a meniscus (i.e., input surface 115 is concave while the opposite surface 125 is convex). In light-emitting device 100, the concave surface of scattering element 120 faces the light-emitting element 110, forming a shell over the light emitting element. In some embodiments, an optical axis of the scattering element 120 is collinear with an optical axis of the recess.

The enclosure is filled with a medium (e.g., a gas, such as air or an inert gas). The scattering element 120 is coupled to the extractor element 130 at surface 125 to form an optical interface comprising or defined by a region of contact between the scattering element 120 and the extractor element 130, through which the extractor element 130 receives light that is output by the scattering element 120. The optical interface is opposite the input surface 115 of the scattering element 120. The scattering element 120 has substantially uniform thickness (e.g., 1 mm), such that a distance between the surface 125 and the input surface 115 of the scattering element 120 is constant across the optical interface.

The scattering element 120 includes elastic scattering centers, inelastic scattering centers, or both elastic and inelastic scattering centers. The inelastic scattering centers convert at least some of the light received from the light-emitting element 110 (e.g., pump light) to longer-wavelength light. For example, the light-emitting element 110 can emit blue light and the scattering element 120 can include inelastic scattering centers (e.g., a phosphor) that convert blue light to yellow light. In embodiments where the scattering element includes a phosphor that is not in direct contact with the light emitting element, such scattering elements may be referred to as a "remote phosphor." The elastic scattering centers isotropically scatter at least some of the light received from the light-emitting element 110 without changing the wavelength of the light. In other words, the elastic scattering centers randomize the directionality of propagation of incident light without changing its wavelength. These scattering centers scatter both, light from the light-emitting element 110 and light that is inelastically scattered from other scattering centers. The result is light that is directionally substantially isotropic and spectrally a mix of light from the light-emitting element 110 and longer-wavelength inelastically scattered light. This mixed light is received by the extractor element 130 through the surface 125.

Examples of scattering elements include light-converting material that is also referred to as photoluminescent or color-converting material, for example. Light-converting materials can include photoluminescent substances, fluorescent substances, phosphors, quantum dots, semiconductor-based optical converters, or the like. Light-converting materials also can include rare earth elements.

The exit surface 135 of extractor element 130 is generally a transparent surface through which the light received by the extractor element 130 is output. In some embodiments, the exit surface 135 is positioned and shaped such that an angle of incidence on the exit surface 135 of the mixed light provided by the scattering element 120 that directly impinges on the exit surface 135 is less than the critical angle for total internal reflection, and thus, such light is output through the exit surface 135 without TIR. For example, the exit surface 135 can be configured to output such light into air without TIR and reflect only a small fraction depending on polarization and incidence angle down to about 4% or below via Fresnel reflection. The ratio between R1 and Ro at which this occurs must be less than or equal to the ratio of the index of refraction for material external to the light-emitting device 100, $n_a$, and n2: Ro/R1<$n_a$/n2. For example, the ambient material can be air in which case $n_a$=1.0. Thus, total internal reflections will be avoided when Ro/R1 is less than the inverse of n2. The extractor element 130 is formed from a transparent material, such as a transparent glass or a transparent organic polymer (e.g., polycarbonate or an acrylate polymer). The corresponding refractive index n2 is typically in a range from about 1.3 to about 1.9.

The recess can be integral to the base substrate 150 or a separate reflective element. In some embodiments, the recess can be configured to provide reflective properties different from reflective properties of other portions of the base substrate 150.

The enclosure, including the recess, is arranged and configured to recover at least a portion of the scattered light that propagates through the input surface 115 into the medium of the enclosure. This means that the enclosure redirects at least a portion of the scattered light back towards the scattering element 120 so that at least some of this light exits the scattering element 120 into the extractor element 130. The design of the enclosure can be selected to reduce the amount of scattered light that returns to the light-emitting element 110 (where it can be absorbed). For example, by placing the light-emitting element 110 into the recess, the amount of light that returns to the light-emitting element 110 and is absorbed can be reduced. The enclosure, including the upper portion 140 and the lower portion 142, can also be configured to direct a large portion of light from the light-emitting element 110 to the scattering element 120.

The surface 155 may extend to the region of contact of the base substrate 150 with the scattering element. In some embodiments, the surface 155 extends to the exit surface 135 of the extractor element.

While the depth of the recess as shown in FIGS. 1A and 1B is larger than the height of the light-emitting diode, the height of the light-emitting element can also be larger than the depth of the recess, i.e., the light-emitting element protrudes beyond the recess into the enclosure.

Figure 2A:
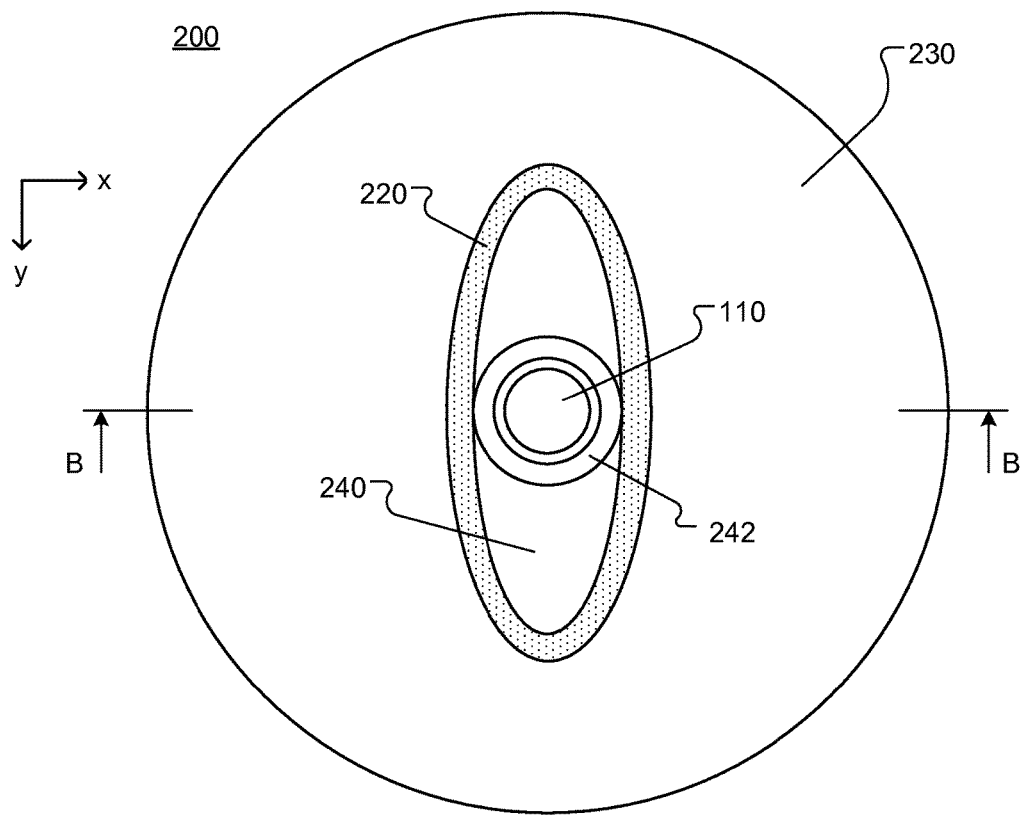
FIGS. 2A-2C are sectional views of another example of a light-emitting device with a recessed light-emitting element.
Figure 2B:
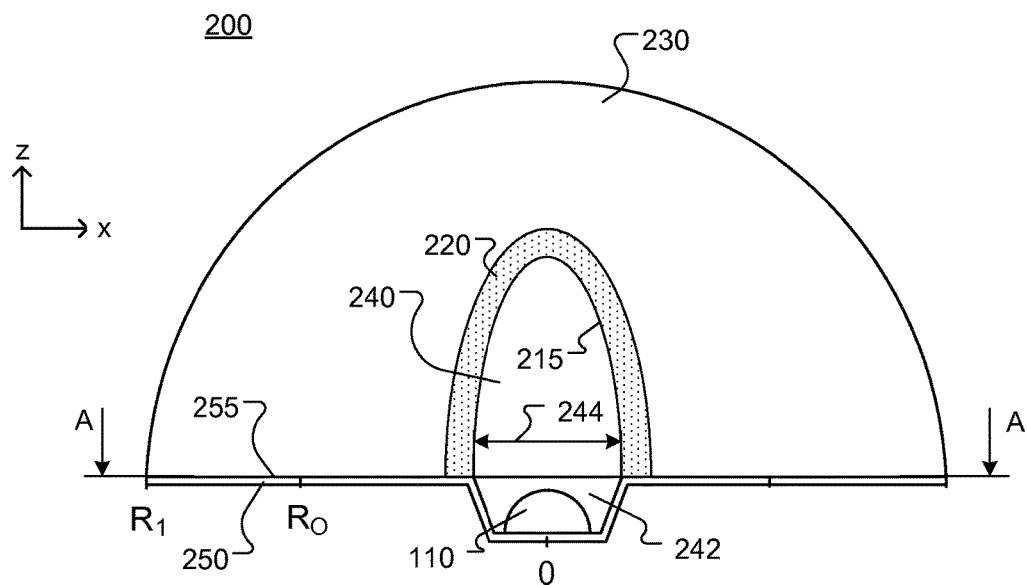
Figure 2C:
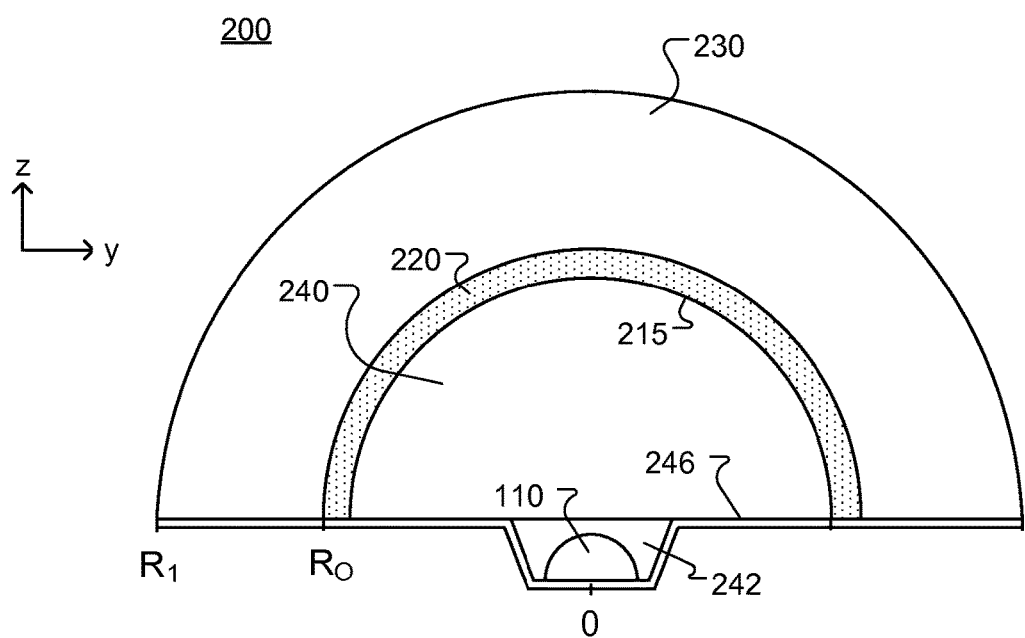

Furthermore, while the scattering element 120 shown in FIGS. 1A and 1B has a substantially hemispherical shape, other shapes are also possible. Referring to FIGS. 2A-2C, for example, in some embodiments, a light-emitting device 200 includes a scattering element 220 that has an ellipsoidal shape. The ellipsoidal shape can be oblate, prolate, or triaxial, for example.

The light-emitting device 200 includes a base substrate 250, a light-emitting element 110, the scattering element 220, and an extractor element 230. The light-emitting element 110 is disposed on a surface 255 of the base substrate 250. The base substrate 250 includes a recess in which the light-emitting element 110 is disposed. The surface 255 can be reflective (e.g., a mirror) to reflect a portion of light emitted by the light-emitting element 110 towards the scattering element 220. The scattering element 220 and at least portion of the base substrate 250 together enclose the light-emitting element and form an enclosure. The enclosure includes an upper portion 240 defined by the planar portion 246 and the input surface 215, and a lower portion 242 defined by the recess. The recess forms a circular aperture 244 with a diameter equal to the diameter of the scattering element 220 across the y-axis. Generally, the aperture can have a circular, ellipsoidal or other shape.

The scattering element 220 has an input surface 215 spaced apart from the light-emitting element 110. The enclosure can be filled with a low refractive index medium (e.g., a gas, such as air or inert gas). The scattering element 220 is coupled to the extractor element 230 to form an optical interface, through which the extractor element 230 receives light that is output by the scattering element 220.

In light-emitting device 200, the minor axis (parallel to the y-axis shown in FIG. 2A) of the ellipse defining the intersection of the scattering element 220 and the surface 255 of the base substrate 250 is substantially the same length as the diameter of the aperture 244, as shown in FIGS. 2A and 2B, i.e., the recess extends to a portion of the ellipse. The major axis (parallel to the X-axis shown in FIG. 2A) of the ellipse defining the intersection of the scattering element 220 and the surface 255 extends beyond the recess. Like light-emitting device 100, the area of the aperture 244 is a fraction of the area enclosed by the footprint on surface 255 of scattering element 220.

Figure 3A:
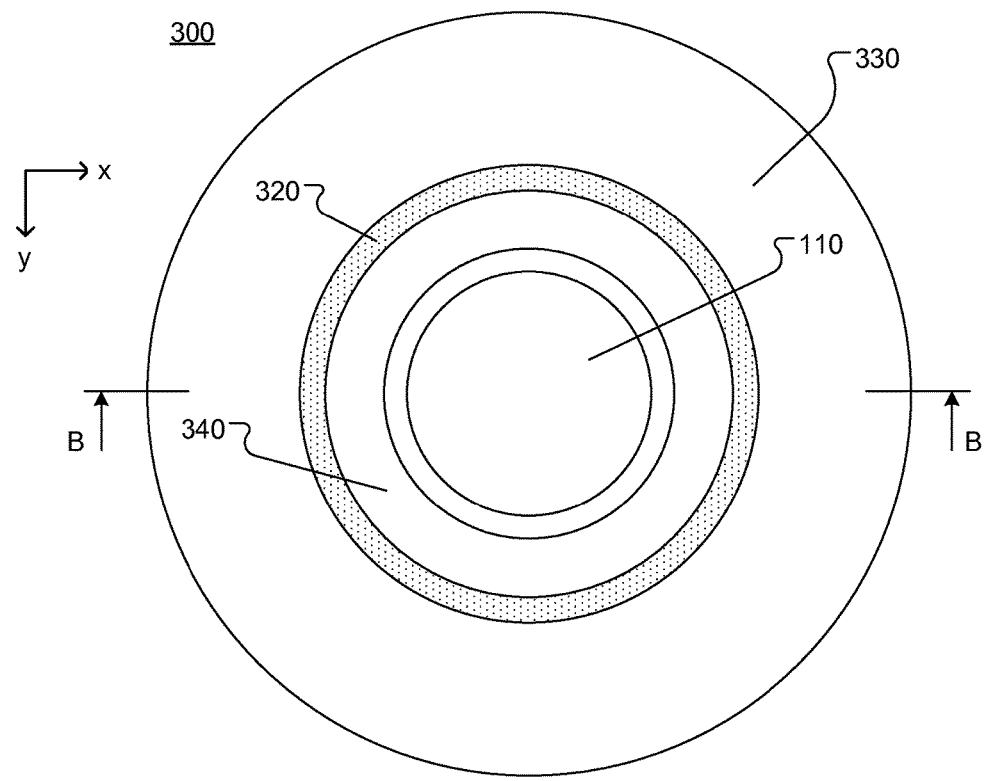
FIGS. 3A-3B are sectional views of another example of a light-emitting device with a recessed light-emitting element.
Figure 3B:
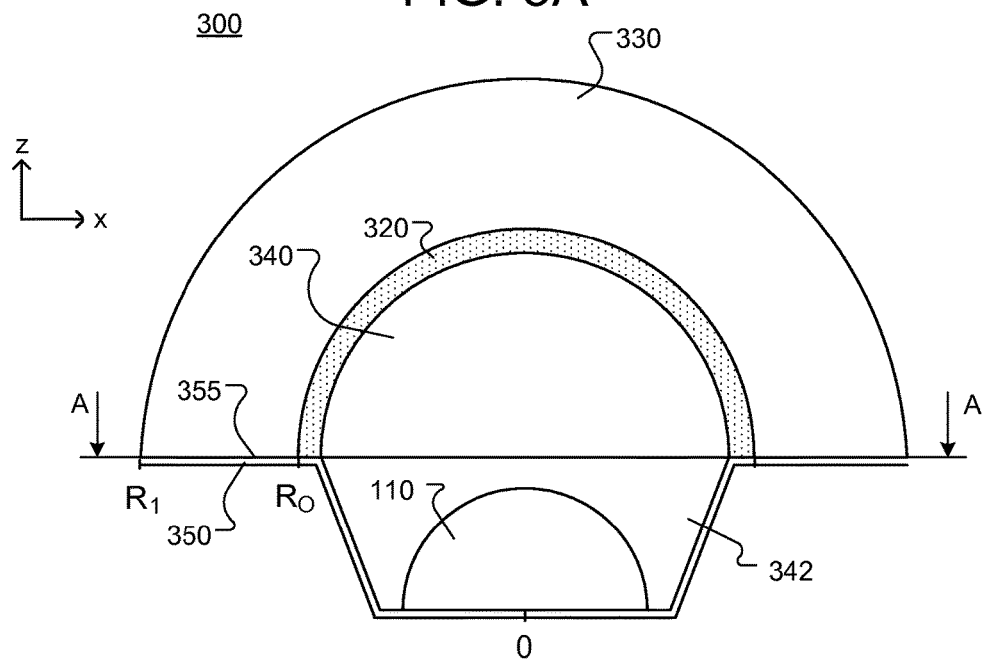

Other configurations of scattering elements and recesses for positioning light-emitting elements are also possible. For example, while in the foregoing embodiments Rx is small relative to Ri, other configurations are also possible. FIGS. 3A-3B are sectional views of an example of a light-emitting device 300 with a hemispherical scattering element 320 and a recess that extends to the scattering element 320 (e.g., with an inside diameter of about 12 mm and an outside diameter of about 14 mm). Similar to the light-emitting device 200, the light emitting device 300 includes a base substrate 350, a light-emitting element 110, the scattering element 320, and an extractor element 330 (e.g., with an outside diameter of about 24 mm). The light-emitting element 110 is disposed in the recess of the base substrate 350. The base substrate 350 has a surface 355, which can be reflective (e.g., a mirror or a diffuse reflector).

The scattering element 320 is spaced apart from the light-emitting element 110. The scattering element 320 and the base substrate 350 together enclose the light-emitting element and form an enclosure, including an upper portion 340 and a lower portion 342. The scattering element 320 is coupled to the extractor element 330 to form an optical interface, through which the extractor element 330 receives light that is output by the scattering element 320.

While the base substrates in the prior embodiments extend to the exit surface of the extractor elements, other configurations are also possible. For example, in some embodiments, at least a portion of the base substrate may extend past the exit surface of the extractor element. The extending base substrate can have a surface with reflective properties to redirect some of the light that is output through the exit surface of the extractor element.

Figure 4:
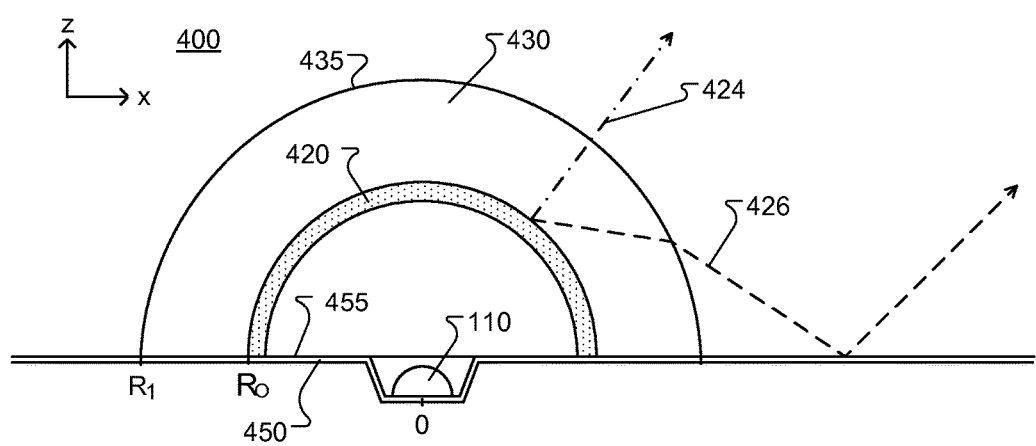
FIG. 4 is a cross-sectional view of an example of a light-emitting device with an external reflector.

FIG. 4 is a cross-sectional side view of an example of a light-emitting device 400 with a base substrate 450 that extends past an exit surface 435 of an extractor element 430. The light-emitting device 400 includes the base substrate 450, a light-emitting element 110, a scattering element 420, and the extractor element 430. The surface 455 of the base substrate that extends past the exit surface 435 of the extractor element 430 can be configured to redirect light that impinges on the surface 455 towards a target area. For example, ray 426 is output by the exit surface 435 of the extractor element 430. Ray 424 propagates from the exit surface 435 away from the base substrate 450. In contrast, ray 426 propagates from the exit surface 435 towards the extended portion of the base substrate 450 and is redirected by the surface 455. The extended portion of the surface 455 outside the extractor element 430 can be a reflective coating or a reflective element that extends along at least a portion of the extended base substrate 450, for example.

In some embodiments, the base substrate 450 extends to the exit surface of the extractor element and an external reflector element can be coupled to the base substrate 450 and/or the extractor element.

Moreover, while the base substrates described above each have a planar portion, non-planar surfaces are also possible. For example, base substrates may include curved surfaces in addition, or as an alternative, to planar surfaces.

Light-emitting elements can be, for example, bare light-emitting diode (LED) dies or encapsulated LED dies, including commercially available LEDs. The light-emitting element 110 is configured to produce and emit light during operation. A spectral power distribution of light emitted by the light-emitting element 110 (also referred to as pump light) can be blue, for instance. The spectral power distribution for visible light is referred to as chromaticity. In general, the light-emitting element 110 is a device that emits radiation in a region or combination of regions of the electromagnetic spectrum for example, the visible region, infrared and/or ultraviolet region, when activated by applying a potential difference across it or passing a current through it, for example. The light-emitting element 110 can have monochromatic, quasi-monochromatic, polychromatic or broadband spectral emission characteristics.

Examples of light-emitting elements that are monochromatic or quasi-monochromatic include semiconductor, organic, polymer/polymeric light-emitting diodes (LEDs). In some embodiments, the light-emitting element 110 can be a single specific device that emits the radiation, for example an LED die, or/and can be a combination of multiple instances of the specific device that emit the radiation together. Such light-emitting device can include a housing or package within which the specific device or devices are placed. As another example, the light-emitting element 110 includes one or more lasers and more specifically semiconductor lasers, such as vertical cavity surface emitting lasers (VCSELs) and edge emitting lasers. In embodiments utilizing semiconductor lasers, the scattering element functions to reduce (e.g., eliminate) spatial and temporal coherence of the laser light, which may be advantageous where the light emitting device may be viewed directly by a person. Further examples of a light-emitting element 110 include superluminescent diodes and other superluminescent devices.

Moreover, while the scattering element is shown in the figures with a constant thickness, the thickness of the scattering element can also vary across its surface.

While the figures only show one light-emitting element, multiple light-emitting elements can also be used. For example, multiple pump light-emitting elements, one or more pump light-emitting elements and one or more chromatic light-emitting elements (e.g., red LEDs), one or more white light-emitting elements and one or more chromatic light-emitting elements, or one or more white light-emitting elements, can be used in the light-emitting device. If white light-emitting elements are used, the light emitting device can include a scattering element with only elastic scattering centers instead of elastic and inelastic scattering centers.

In general, the light emitting devices described herein may have a variety of form factors. In some embodiments, they may be formed to fit a standard light socket (e.g., an Edison socket) and/or may be formed to replace a conventional (e.g., incandescent or compact fluorescent) bulb. For example, the light-emitting devices can be formed to replace a PAR-type bulb or an A-type bulb (e.g., an A-19). In other embodiments, light-emitting devices as described herein may be employed as components in other luminaires. In general, the light emitting devices can have axial symmetry, a specific rotational symmetry (e.g., extended along an axis out of the plane of the page) or have no particular symmetry.

The embodiments described herein can be configured to provide small amounts of backscattered light that impinge on the light-emitting element even if the backscattered light may be subject to multiple reflections and/or absorption in the enclosure. As such, placing the light-emitting element in a recess out of the way of the propagation paths of a large portion of the backscattered light can provide a light-emitting device with small internal light losses.

Generally, small light-emitting element geometries (e.g., a Rebel™ pump including a 1×1 mm² chip under a 2.5 mm radius dome) in conjunction with a larger scattering element (e.g., a 10 mm diameter semi-spherical phosphor dome) can be very efficient.

In some embodiments, the light that is output through the exit surface of the extractor element in a backward direction (i.e., towards the base substrate) can be converted into a forward distribution by extending the reflective surface of the base substrate, for example as shown in FIG. 4, beyond the outside edge of the extractor element. An additional narrowing of the light distribution can be achieved by adding a conical reflective section to the extended base substrate, for example. In some embodiments, the reflective elements can be a separate from the base substrate and coupled to the base substrate and/or the extractor element.

In some embodiments, the scattering element can have an ellipsoidal shape (e.g., as shown in FIGS. 2A-2C) with three orthogonal axis of independent length. For example, if the shortest ellipsoidal axis (i.e., minor axis) equals the diameter of the aperture of the recess and lies in the plane of this aperture and the center of the ellipsoid is coincident with the center of aperture, then the elliptical cross section is larger than the aperture. Thus, only a portion of the backscattered light enters the recess and the probability of light being absorbed by the light-emitting element is reduced. The ellipsoidal shape of the scattering element can provide a maximum light distribution in the direction of the shortest ellipsoidal axis (i.e., minor axis) and lower light distribution in the direction of the longer ellipsoidal axis.

What is claimed is:

1. A light-emitting device comprising:
an LED pump or a semiconductor laser configured to emit pump light during operation;
a phosphor element having a first surface spaced apart from the LED pump or semiconductor laser and positioned to receive at least some pump light from the LED pump or semiconductor laser, the phosphor element configured to convert pump light to converted light and to scatter non-converted pump light, wherein the converted pump light and the scattered non-converted pump light are provided by the phosphor element as scattered light;
an extractor element formed from a transparent material having an exit surface, the extractor element being arranged to receive a portion of the scattered light through a region of contact with the phosphor element; and
a reflector forming a recess, the LED pump or semiconductor laser being disposed in the recess, the reflector and the phosphor element defining an enclosure into which pump light from the LED pump or semiconductor laser is emitted, at least a portion of the first surface having a concave shape with respect to the enclosure, wherein
a medium having a refractive index no is disposed adjacent the first surface of the phosphor element, and the phosphor element comprises a material having a first refractive index $n_1$, where $n_0<n_1$, and the transparent material has a refractive index $n_2$, where $n_0<n_2$, and
the exit surface is shaped and positioned such that an angle of incidence on the exit surface of the scattered light from the region of contact that directly impinges on the exit surface is less than the critical angle for total internal reflection.

2. The light-emitting device of claim 1, wherein the first surface extends laterally beyond the recess.

3. The light-emitting device of claim 2, wherein an area of an aperture of the recess is a fraction of an area of the base substrate enclosed by the scattering element.

4. The light-emitting device of claim 3, wherein the fraction is about ten percent or less.

5. The light-emitting device of claim 1, wherein a height of the LED pump or semiconductor laser is 1.5 times a height of the recess or less.

6. The light-emitting device of claim 5, wherein the height of the LED pump or semiconductor laser is less than the height of the recess.

7. The light-emitting device of claim 1, wherein the recess extends to at least two points of the first surface.

8. The light-emitting device of claim 1, wherein the recess extends to the first surface.

9. The light-emitting device of claim 1, wherein the phosphor element is a shell.

10. The light-emitting device of claim 9, wherein the shell has a spherical shape.

11. The light-emitting device of claim 9, wherein the shell has an ellipsoidal shape.

12. The light-emitting device of claim 11, wherein the ellipsoidal shape is prolate or oblate.

13. The light-emitting device of claim 11, wherein the ellipsoidal shape is triaxial.

14. The light-emitting device of claim 1, wherein an optical axis of the recess is collinear with an optical axis of the phosphor element.

15. The light-emitting device of claim 1, wherein the recess is configured to provide reflective properties different from reflective properties of other portions of the reflector.

16. The light-emitting device of claim 1, wherein the phosphor element contacts the reflector.

17. The light-emitting device of claim 1, wherein the reflector extends to the exit surface.

18. The light-emitting device of claim 1 further comprising an external reflector extending from the exit surface.

19. The light-emitting device of claim 18, wherein the external reflector and the reflector are integrally formed.

20. The light-emitting device of claim 18, wherein the external reflector and the reflector are formed from different materials.

21. The light-emitting device of claim 1, wherein $n_1 \leq n_2$.

22. The light-emitting device of claim 1, wherein the phosphor element comprises inelastic and elastic scattering centers.

23. The light-emitting device of claim 22, wherein the inelastic and elastic scattering centers are configured to substantially isotropically scatter light.

* * * * *

UNITED STATES PATENT AND TRADEMARK OFFICE
CERTIFICATE OF CORRECTION

| | |
|---|---|
| PATENT NO. | : 10,107,459 B2 |
| APPLICATION NO. | : 14/892549 |
| DATED | : October 23, 2018 |
| INVENTOR(S) | : Roland H. Haitz and Hans Peter Stormberg |

Page 1 of 1

It is certified that error appears in the above-identified patent and that said Letters Patent is hereby corrected as shown below:

On the Title Page

In the Title (54), and in the Specification, Column 1, Lines 2-3, delete "LIGHT EMITTING" and insert -- LIGHT-EMITTING -- therefor.

In the Claims

Column 12, Line 21, in Claim 1, delete "no" and insert -- $n_0$ -- therefor.

Signed and Sealed this
First Day of January, 2019

Andrei Iancu
*Director of the United States Patent and Trademark Office*